US008082662B2

(12) United States Patent
Schroeder et al.

(10) Patent No.: US 8,082,662 B2
(45) Date of Patent: Dec. 27, 2011

(54) INSTALLATION DEVICE FOR A GRADIENT COIL MODULE IN A MAGNETIC RESONANCE TOMOGRAPHY APPARATUS

(75) Inventors: Martin Schroeder, Fuerth (DE); Bernhard Wolf, Poing (DE)

(73) Assignee: Siemens Aktiengesellschaft, Munich (DE)

( * ) Notice: Subject to any disclaimer, the term of this patent is extended or adjusted under 35 U.S.C. 154(b) by 561 days.

(21) Appl. No.: 12/347,328

(22) Filed: Dec. 31, 2008

(65) Prior Publication Data
US 2009/0172940 A1    Jul. 9, 2009

(30) Foreign Application Priority Data
Jan. 4, 2008    (DE) .......................... 10 2008 003 172

(51) Int. Cl.
*B23P 19/00* (2006.01)
(52) U.S. Cl. .................. 29/760; 29/50; 29/729; 29/732; 29/759

(58) Field of Classification Search ................ 29/760, 29/50, 508, 729, 732, 734, 759; 310/40 R, 310/91, 216.049; 324/260, 318
See application file for complete search history.

(56) References Cited

U.S. PATENT DOCUMENTS

| 5,783,943 | A | 7/1998 | Mastandrea, Jr. et al. |
| 6,111,412 | A | 8/2000 | Boemmel et al. |
| 6,642,717 | B2 | 11/2003 | Dietz et al. |
| 7,463,028 | B2 * | 12/2008 | Dietz et al. ..................... 324/318 |
| 7,653,986 | B2 * | 2/2010 | Majernik et al. ................. 29/732 |

FOREIGN PATENT DOCUMENTS
DE    197 22 211 A1    8/1998
* cited by examiner

*Primary Examiner* — Thiem Phan
(74) *Attorney, Agent, or Firm* — Schiff Hardin LLP

(57) ABSTRACT

An installation device for a gradient coil module in a magnetic resonance tomography apparatus has a loading cart that moves the gradient coil module away from and to the magnetic resonance tomography apparatus. A bearing girder having a track is fastened to the loading cart. Track rollers can be installed on the gradient coil module such that the gradient coil module can be moved relative to the loading cart by means of the track rollers resting on the track.

17 Claims, 7 Drawing Sheets

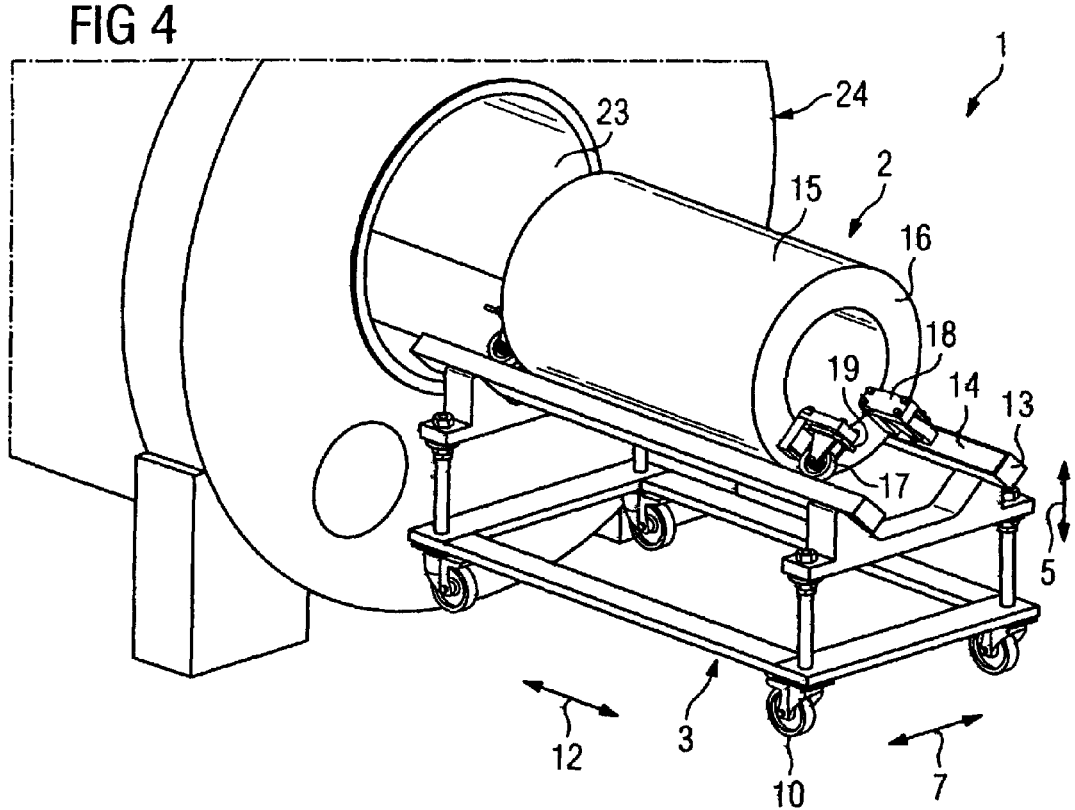
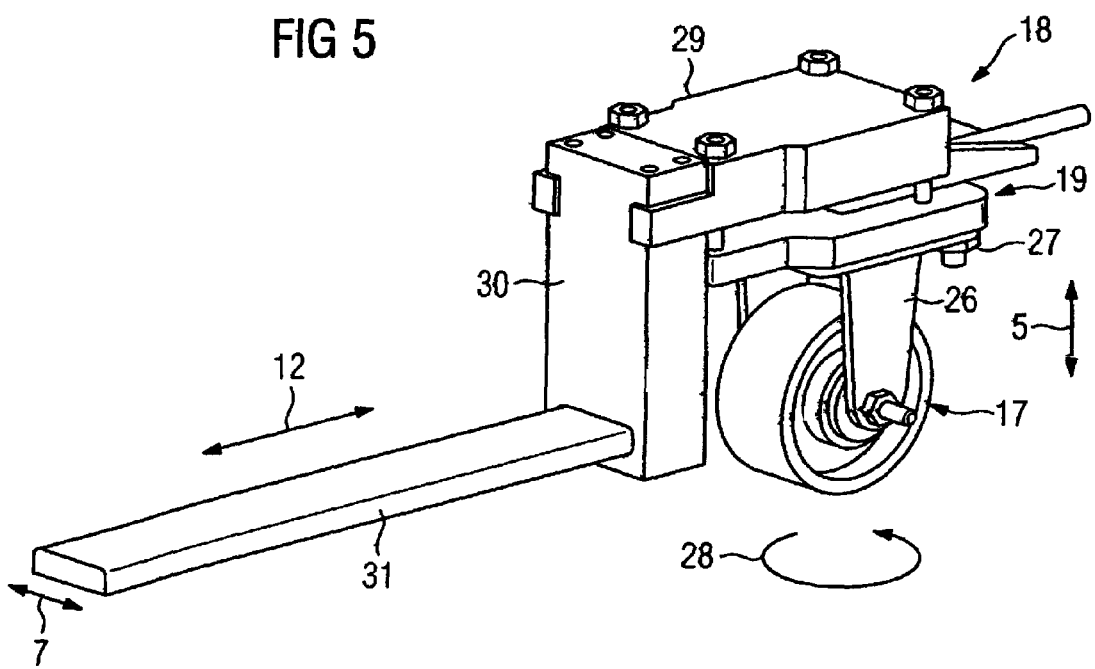

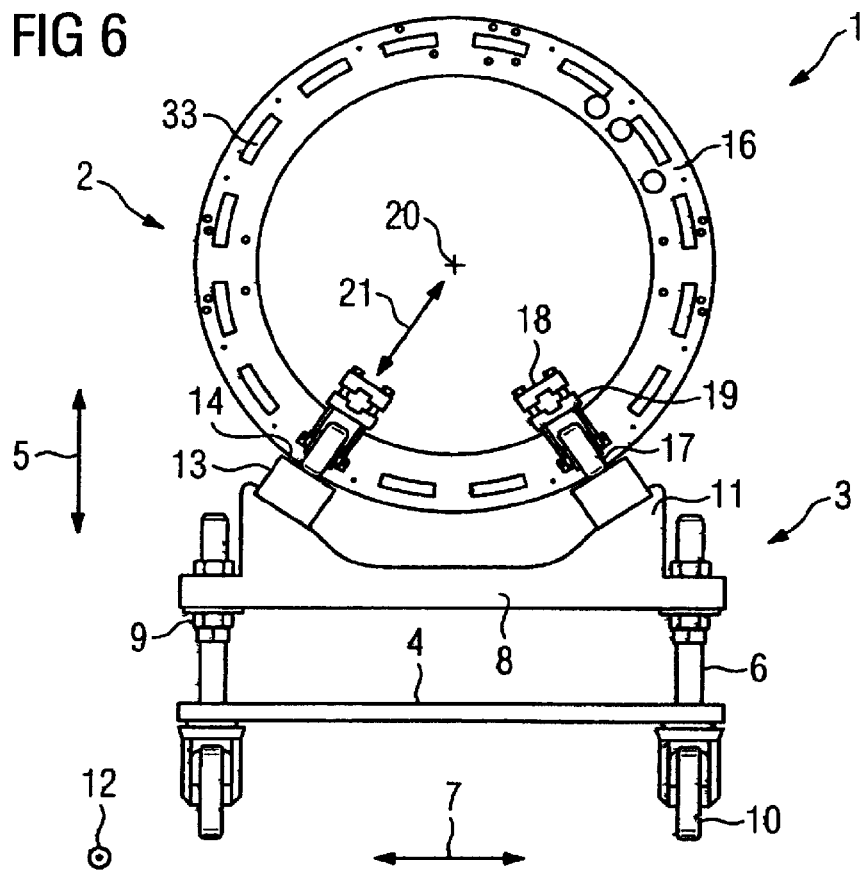
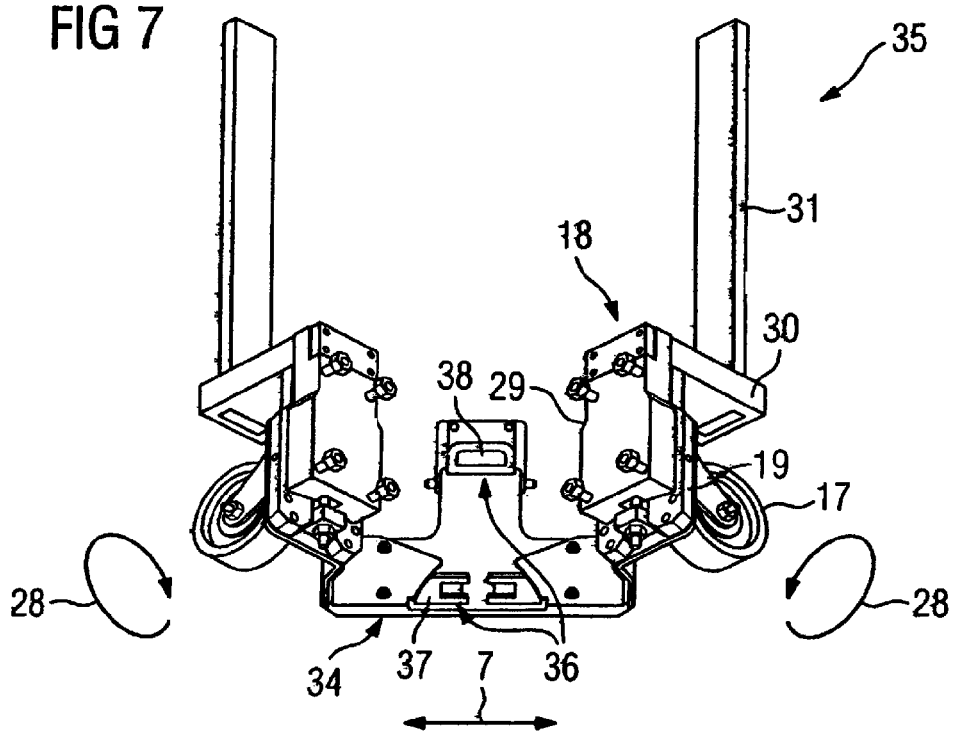

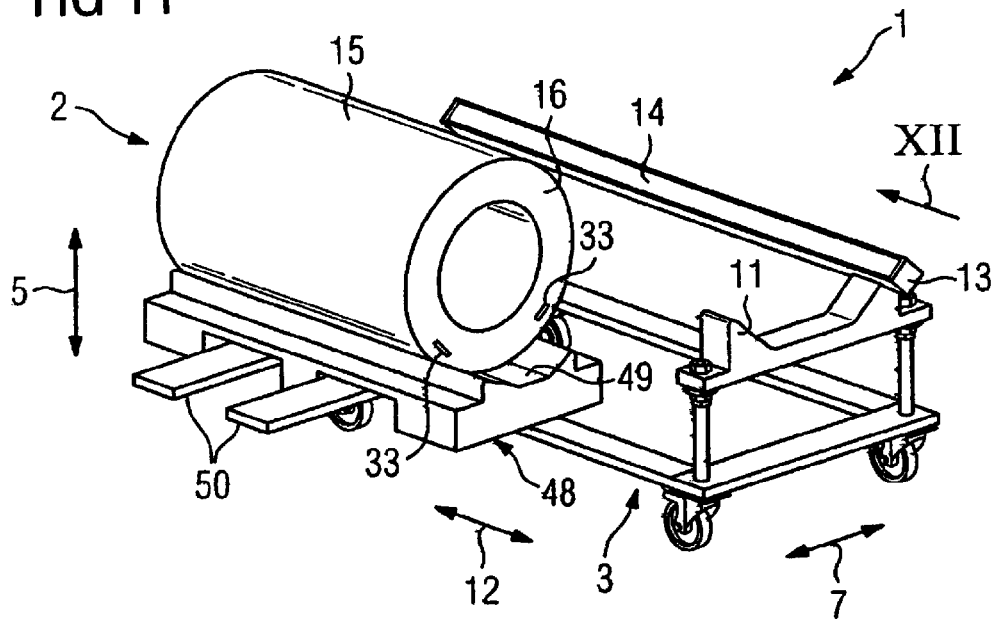
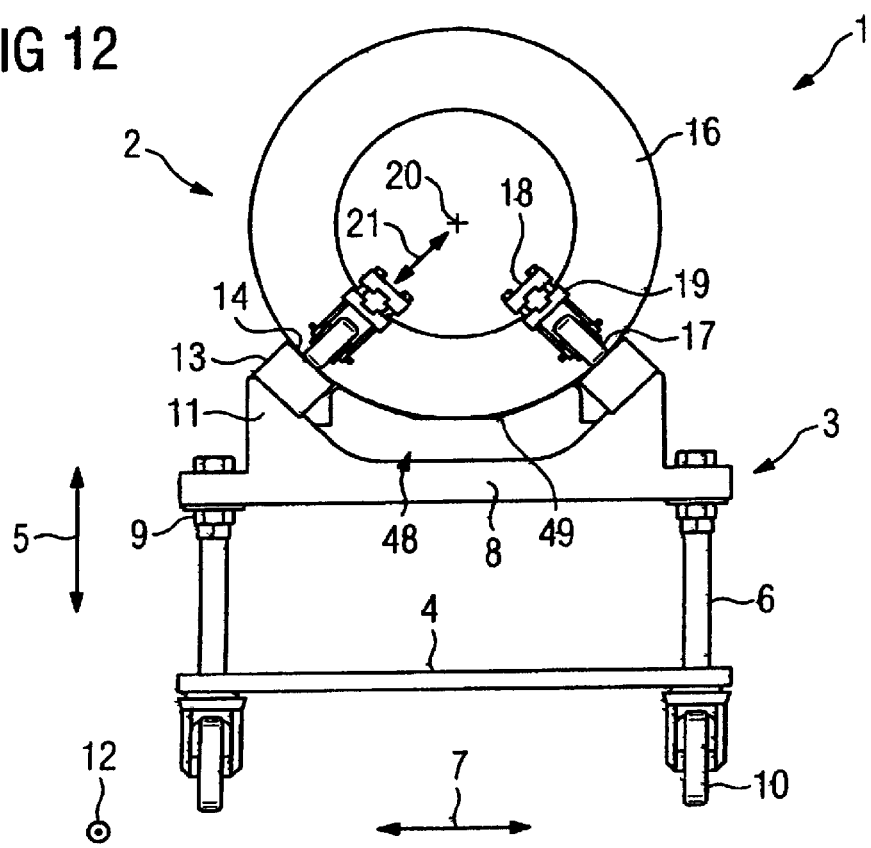

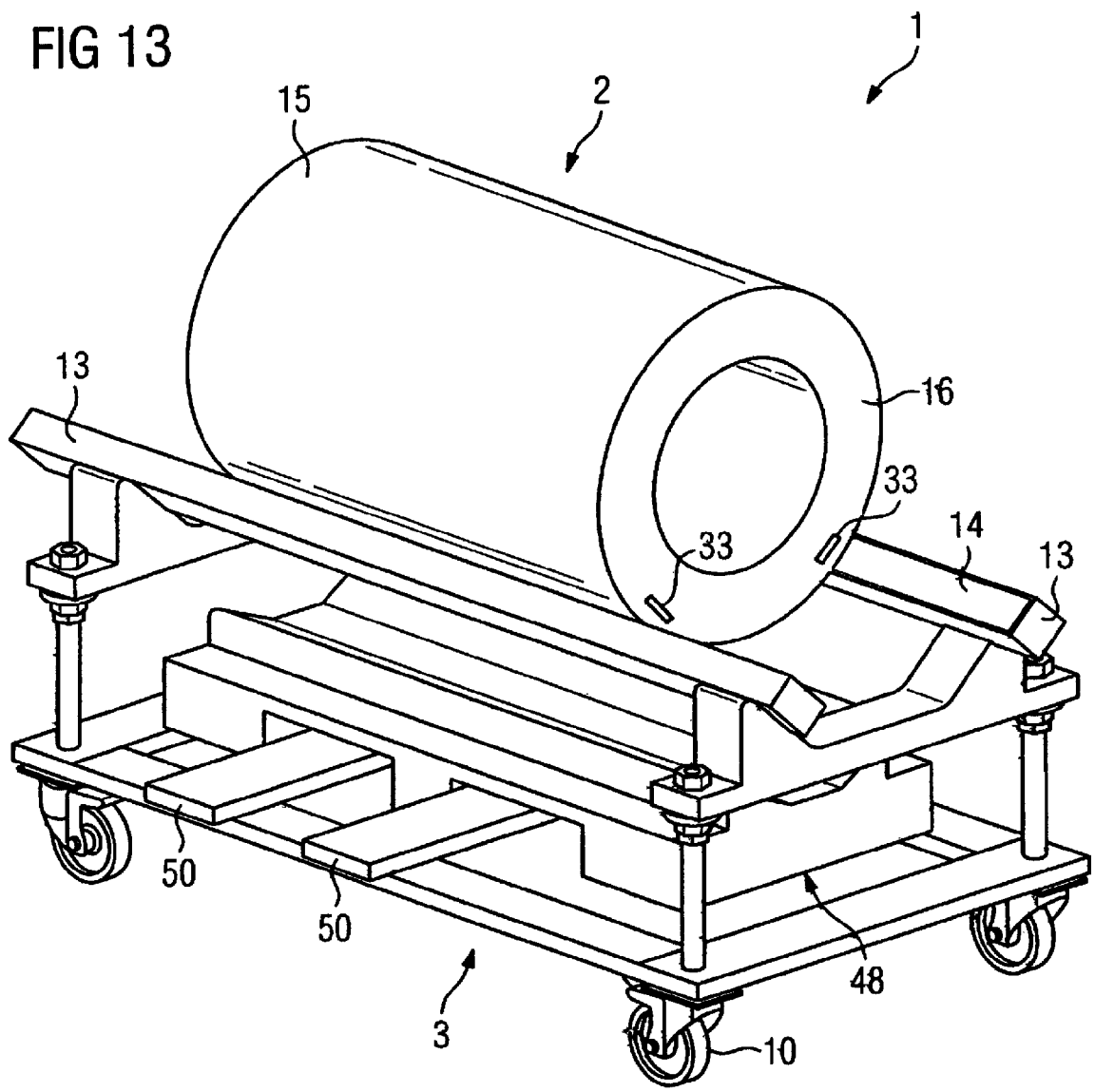

INSTALLATION DEVICE FOR A GRADIENT COIL MODULE IN A MAGNETIC RESONANCE TOMOGRAPHY APPARATUS

BACKGROUND OF THE INVENTION

1. Field of the Invention

The invention concerns an installation device for a gradient coil module in a magnetic resonance tomography apparatus.

2. Description of the Prior Art

A magnetic resonance tomography apparatus is an imaging medical diagnostic modality. A magnetic resonance tomography apparatus has a basic field magnet to provide a basic magnetic field. This basic field is overlaid with at least one magnetic field gradient. This occurs by means of a gradient coil module that is arranged in the basic field. For example, the design of such a gradient coil module is described in DE 197 21 985 A1, DE 197 22 211 A1 and DE 100 32 836 C1. Such a high-current module has multiple layers of gradient coils in order to generate three magnetic field gradients situated perpendicularly to one another. Furthermore, at least one cooling layer is provided to transport away the heat produced by the gradient coils. This cooling layer is arranged between two layers of gradient coils. The layers of gradient coils and the at least one cooling layer are cast with one another in a casting compound made of plastic and together form the gradient coil module.

The gradient coil module is installed in a channel-like gradient coil receptacle of the magnetic resonance tomography apparatus. An exchange or a disassembly and reassembly off the gradient coil module is necessary at specific time intervals for maintenance purposes.

In a conventional magnetic resonance tomography apparatus with a magnetic field strength of up to 3 Tesla, the basic field magnet is deactivated for the disassembly. The deactivation and reactivation of the basic magnetic field takes approximately four hours. In a magnetic resonance tomography apparatus based on the ultra-high frequency technique (UHF) with a magnetic field strength of the basic field magnet of up to over 7 Tesla, such deactivation and reactivation are associated with a high cost and time expenditure, since multiple days must be planned for the deactivation and reactivation of the basic field magnet. The magnetic resonance tomography apparatus is not available for measurements in this time period, but consumes a large amount of electrical energy. Therefore, in particular for a magnetic resonance tomography apparatus based on the UHF technique, it is typical to uninstall and reinstall the gradient coil module with the basic field magnet activated in order to keep the downtime of the magnetic resonance tomography apparatus as small as possible.

The installation and uninstallation typically occur with the use of a number of height-adjustable supports (stands) by means of which an installation girder is introduced into the gradient coil receptacle. A travel sled is borne on the installation girder such that it can be longitudinally displaced. After releasing the mountings by means of which the gradient coil module is fastened in the gradient coil receptacle, the inner wall of the gradient coil module is braced on the travel sled so that the gradient coil module can be pulled out from the gradient coil receptacle with the travel sled. The positioning of the installation girder and the extraction of the gradient coil module by means of the travel sled are associated with a high personnel cost, since the individual supports and the installation girder are not permanently connected with one another, and must be assembled. For a magnetic resonance tomography apparatus with large dimensions and a deep gradient coil receptacle, moreover, the insertion of a long installation girder is additionally necessary in order to reach to the installation location of the gradient coil module. The alignment of a long installation girder is complicated.

An installation girder produced from one beam always has a residual magnetism. Therefore, with an activated basic magnetic field, the installation girder is pulled from this field such that the disassembly and reassembly of the gradient coil module is made more difficult. This difficulty in particular occurs in UHF systems. Even a fixing of the installation girder to the supports by means of screw clamps or the like only slightly improves the mechanical stability of the installation device. Furthermore, the installation girder bends under the weight of the gradient coil module, such that the sliding of the gradient coil module into the gradient coil receptacle by means of the travel sled is hindered. Bracing of the installation girder inside the gradient coil receptacle is not possible.

SUMMARY OF THE INVENTION

An object of the invention is to provide an installation device for a gradient coil module with which installation and de-installation of the gradient coil module can be conducted in a simple and quick manner.

This object is achieved according to the invention by an installation device that has a loading cart to move the gradient coil module away from and toward the magnetic resonance tomography apparatus, i.e. the scanner housing thereof. At least one bearing girder has a track that is attached on the loading cart. Track rollers can be mounted on the gradient coil module such that the gradient coil module can be moved relative to the loading cart by means of the track rollers resting on the track. In other words, the gradient coil module is supported on the track by means of its track rollers and can be moved in the manner of a cart counter to the track and the loading cart. A simpler transport of the gradient coil module toward the magnetic resonance apparatus housing or away from it is ensured by means of the loading cart.

For the installation of the gradient coil module in the magnetic resonance tomography apparatus, the track rollers are initially installed on the gradient coil module. For example, this occurs before the gradient coil module is placed on the track of the bearing girder associated with the loading cart. The loading cart is subsequently moved to the gradient coil receptacle of the magnetic resonance tomograph by means of its rollers. It is thereby positioned so that the inside of the gradient coil receptacle essentially forms a continuation of the track of the bearing girder. The gradient coil module is subsequently slid with its track rollers relative to the loading cart and its track and is thereby rolled into the gradient coil receptacle. The fact that the gradient coil module is accommodated with play by the gradient coil receptacle is thereby utilized so that space is provided for a projection of the track rollers beyond the gradient coil module, and therefore for a rolling of the gradient coil module into the gradient coil receptacle. The gradient coil receptacle is finally fastened in the gradient coil receptacle by means of fastening elements. The track rollers are thereby unburdened of the weight of the gradient coil module so that they can be uninstalled without problems.

An uninstallation of the gradient coil module from the magnetic resonance tomography apparatus ensues in the reverse manner. First the track rollers are installed on the gradient coil module while it is still in the installed state. The fastening elements between the gradient coil module and the gradient coil receptacle are subsequently released. Now the gradient coil module is rolled out from the gradient coil receptacle via its track rollers on the track of the track girder that has already been provided. Finally, the gradient coil module can be moved to its destination by means of the loading cart.

Overall, a simple and quick installation and de-installation of the gradient coil module is thus achieved. A complicated and intricate handling, for example by means of an installation girder and one or more of supports holding the installation girder as already described, does not need to occur. Since the track rollers brace the gradient coil module in a defined manner, its de-installation and installation can be conducted with small effort, and thus with less personnel expenditure. Furthermore, the de-installation and installation of the gradient coil module can be conducted with a small risk for the appertaining personnel and with a small risk of damage to the gradient coil module. In the previously typical installation methods, the danger namely always existed that the installation girder might lose its balance and thus would fall to the floor together with the gradient coil module transported on it by means of the travel sled. In a magnetic resonance tomography apparatus in which the basic magnetic field is not turned off for maintenance purposes, the danger additionally exists that an installation girder exhibiting a residual magnetism is attracted by the basic magnetic field, and the gradient coil module therefore loses its balance and falls to the floor.

A track roller mount to install a track roller on the gradient coil module is advantageously provided. The track roller is fastened to the gradient coil module in a predetermined manner by means of the track roller mount. Furthermore, the track roller mount predetermines the position of the track roller relative to the track, such that the gradient coil module can always be slid in the same manner on the track.

Given a hollow cylindrical gradient coil module, it is advantageously provided that the track rollers project beyond the cylinder jacket of the gradient coil module. The projection of the track rollers is thereby selected so that it is smaller than the play of the gradient coil module in the gradient coil receptacle. It is thus ensured that the gradient coil module with its track rollers can roll freely even inside the gradient coil receptacle.

The track roller mount is advantageously executed so as to be height-adjustable. The track roller mount can be installed in this way even when the gradient coil module is really supported on the track of the bearing girder or on the inside of the gradient coil receptacle. After the installation of the track roller mount, the track roller is moved (by means its height adjustment) towards the track or the inside of the gradient coil receptacle until it supports the mass of the gradient coil module and the gradient coil module can be freely rolled.

In an embodiment, the bearing girder is executed so as to be height-adjustable. The track of the bearing girder can thus always be adjusted in terms of its height so that it forms a continuation of the inside of the gradient coil receptacle. This precludes the gradient coil module from becoming stuck upon rolling into or out of the gradient coil receptacle.

In another embodiment, two bearing girders facing one another are provided. If at least one track roller attached to the gradient coil module runs on each of the two tracks, a particularly stable bearing and support of the gradient coil module via the track rollers is achieved in this manner.

In a further embodiment, two track rollers are provided in the installed state on each of the two facing sides of the gradient coil. In this way the gradient coil is supported over its entire length by means of the track rollers. A particularly stable bearing of the gradient coil module via the track rollers can thus be achieved in the manner of a four point support, in particular when the track rollers point radially outward given a hollow cylindrical gradient coil and two bearing girders pointing toward one another.

A blade-like extension is advantageously provided at the track roller mount for insertion into a recess essentially extending from the facing side of the gradient coil into its wall in the longitudinal direction. A simple and tool-free installation of the track roller is achieved in this manner by means of the insertion or plugging-in of the blade-like extension into the recess. A time-consuming installation of the track roller at the gradient coil module, for example using fastening elements such as bolts or the like, thus can be omitted.

In another embodiment, the recesses are fashioned in the shape of pockets and are normally provided to accommodate shim elements. The production of a gradient coil module with shim elements is described in DE 197 222 11 A1, for example. The shim elements are metal bands that are inserted into the recesses provided on the front side of the gradient coil module to homogenize the gradient field. In other words, the fact that a gradient coil module is often provided with pocket-like recesses into which the shim elements can be reversibly inserted is hereby utilized. A shim element is therefore simply drawn out from its recess for a fastening of a track roller mount with its blade-like extension. The provision of the gradient coil module with additional recesses to accommodate the track roller mount can be spared. After the uninstallation of the track rollers, the shim elements are simply inserted into the recesses again.

In another embodiment, the track roller can be installed transverse to the middle longitudinal axis of the gradient coil module. For this purpose the track roller is advantageously fastened on the track roller mount via an installation plate. The installation plate can thereby be fastened at the track roller mount such that the track roller is aligned either in the direction of the middle longitudinal axis or transverse to the middle longitudinal axis. For this purpose, the track roller mount is installed at the gradient coil module with transversely arranged track rollers. In another advantageous variant, a swivel joint that enables a rotation of the track roller transverse to the middle longitudinal axis can be provided between track roller and track roller mount. For this the track roller is rotated by means of the swivel joint transverse to the middle longitudinal axis given an installed track roller mount. A displacement capability of the gradient coil module around its middle longitudinal axis is thus achieved in the circumferential direction. The position of the gradient coil module thus can be corrected in the circumferential direction until the installation end position is reached.

In another embodiment, two track roller mounts are connected with one another like a bridge. In other words, their position (and thus the position of the track rollers held by them) are defined relative to one another. The track roller mounts mutually support one another in this manner. The track rollers therefore exhibit only a slight play so that a smooth rolling of the gradient coil module on the two tracks of the track girder is achieved. Furthermore, the two track roller mounts form an installation unit with the track rollers held by them and the bridge-like connection.

The installation device has an installation tool to install and de-install the track roller mounts in the state of the gradient coil module in which it is inserted into the gradient coil receptacle. The installation device has a height adjustment tool for height adjustment of the track rollers in the state of the gradient coil module in which it is inserted into the gradient coil receptacle. A positioning device to position the gradient coil module in the circumferential direction in the state of the gradient coil module in which it is inserted is provided. In particular, a poorly accessible gradient coil module of a magnetic resonance tomography apparatus that is executed in the UHF technique with a length gradient coil receptacle can thus be installed and de-installed without a maintenance technician having to stay inside the gradient coil receptacle. The installation or, respectively, uninstallation of the gradient coil module can thus proceed without risk to the maintenance technician, even given an activated basic magnetic field.

In another embodiment, the installation device comprises a pallet adapted to the geometry of the gradient coil module to bear it in the de-installed state. A pallet for a hollow cylindrical gradient coil module accordingly has a channel-like depression by means of which a rolling of the gradient coil module in and out can be avoided during transport. The gradient coil module can additionally be handled more simply by means of the pallet. For example, it can be moved in a simple manner by means of a forklift or the like. In this way the track rollers are installed in a mechanically unloaded state when the gradient coil module is borne on the pallet.

In another embodiment, at least one of the bearing girders fastened to the loading cart can be uninstalled by means of a detachable connection. For example, this can be a bolt connection or the like. A placement of the gradient coil module on the tracks of the bearing girder can be simplified in this way. For example, it is advantageous to feed a hollow cylindrical gradient coil module to a loading cart with two bearing girders from the side, wherein one of the two bearing girders is uninstalled. If the gradient coil module (elevated by means of a forklift, for example) is located above the loading cart the second bearing girder is installed. The gradient coil module with its track rollers is subsequently set on the two bearing girders.

Individual components of the installation device, in particular the track rollers and the track roller mount, are appropriately produced form a non-magnetic material, for example from aluminum or an austenitic steel. If the installation or de-installation of the gradient coil module is implemented in an active basic magnetic field, this results in no attraction of the track rollers or the track roller mounts by the basic magnetic field occurring, such that rolling into or out from the gradient coil receptacle is in no way hindered by magnetic attraction.

BRIEF DESCRIPTION OF THE DRAWINGS

FIG. 4 shows the installation of the gradient coil module in a magnetic resonance tomography apparatus.

FIG. 5 shows a track roller fastened to a track roller mount.

FIG. 6 shows the installation device and a second gradient coil module.

FIG. 7 shows two track roller mounts connected with one another like a bridge.

FIG. 11 illustrates the placement of the first gradient coil module on the installation device.

FIG. 12 shows the gradient coil module of FIG. 8 in the state in which it is placed on the installation device, in a frontal view.

FIG. 13 shows the gradient coil module from FIG. 8 in the state in which it is placed on the installation device, in a three-dimensional view.

DESCRIPTION OF THE PREFERRED EMBODIMENTS

Figure 1:
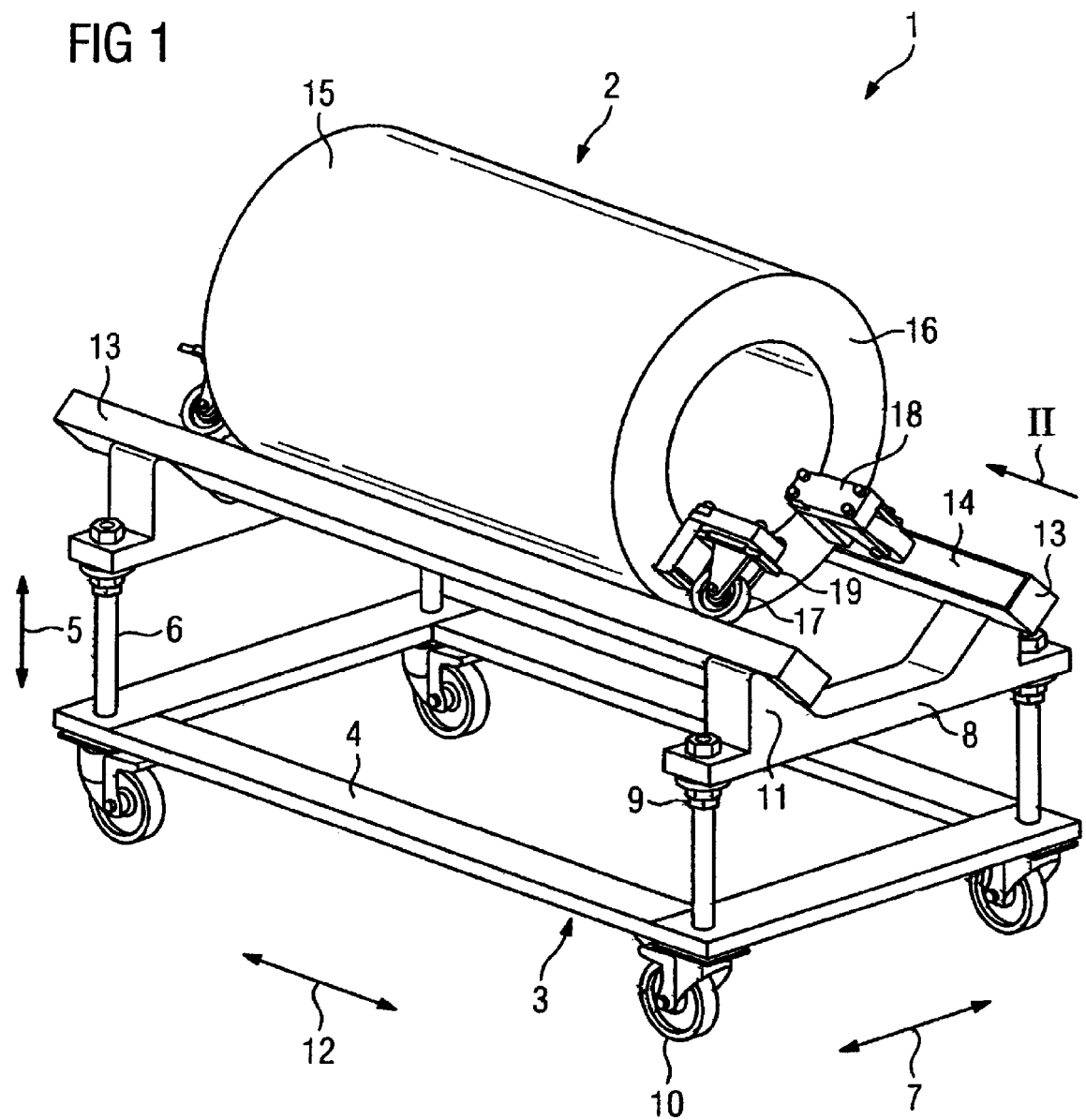
FIG. 1 shows an installation device for a first gradient coil module in a three-dimensional view.

According to FIG. 1, an installation device 1 has a loading cart 3 for a gradient coil module 2. The loading cart 3 is formed by a frame 4 and four support webs 6 extending upwards in the vertical direction 5 from the corners of the frame 4. Two support webs 6 are respectively connected with one another in the transverse direction 7 at their upper free ends by means of a bearing bracket 8. The support webs are executed as threaded rods (whose thread is not shown in FIG. 1). The two bearing brackets 8 are height-adjustable in the vertical direction 5 by means of the rotation of an adjustment nut 9 at each support web 6. A transport roller 10 is respectively installed at the underside of the four corners of the frame 4.

Each of the two bearing brackets 8 possesses in the transverse direction an installation slope 11 at its free ends. Each installation slope 11 rises from the top of the bearing bracket 8 in the transverse direction 7 to the free end of the bearing bracket 8 at approximately a 45° angle, such that the two installation slopes 11 of a bearing bracket 8 are facing one another. The two bearing brackets 8 are mounted on the support webs 6 so that they are aligned with one another in the longitudinal direction 12. Two installation slopes 11 of the two bearing brackets 8 thus also respectively align with one another. A bearing girder 13 oriented in the longitudinal direction 12 is fastened with its underside on two respective installation slopes 11 aligned with one another. Each of the two bearing brackets 13 possesses a track 14 on its top side so that the two track surfaces 14 of the two bearing brackets 13 are facing one another exactly like the installation slopes 11.

The gradient coil module 2 has a hollow cylindrical geometry with a cylinder jacket 15 and two facing sides 16. The gradient coil module 2 comprises multiple layers of gradient coils (not shown) that are cast with one another by means of a casting compound and are combined into the gradient coil module 2 according to manner described in DE 197 21 985 A1, for example. Two track rollers 17 are respectively fastened to a track roller mount 18 on each of the two facing sides 16 of the gradient coil module 2 by means of an installation plate 19. The in total four track rollers 17 thus support the gradient coil module 2 on the two tracks 14 of the bearing girders 13.

Figure 2:
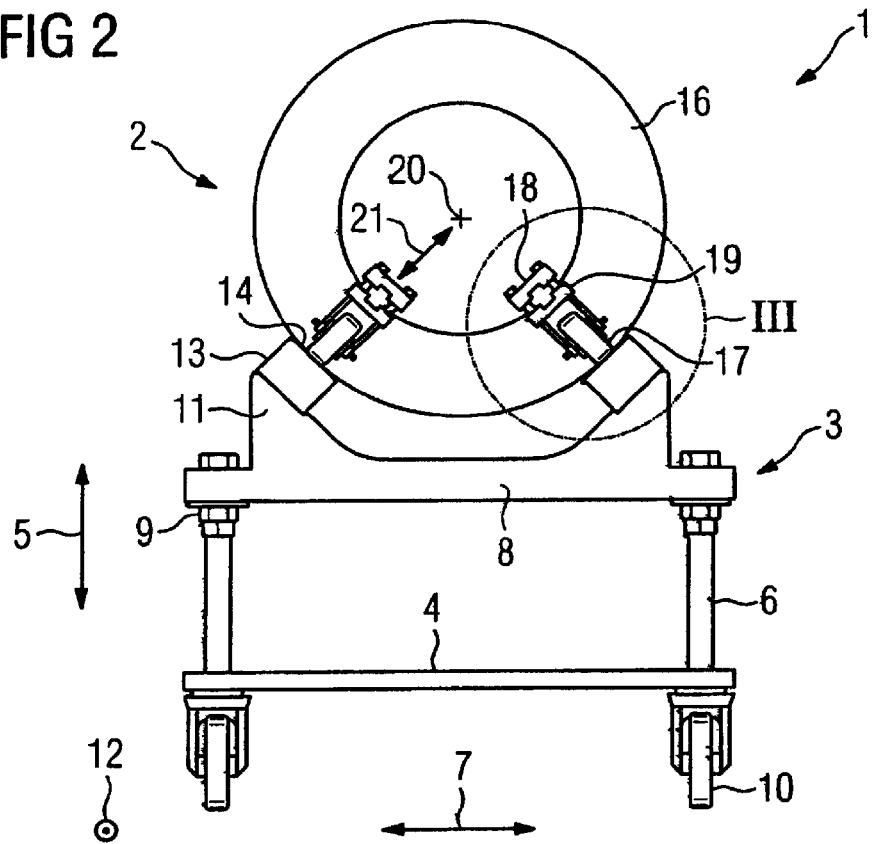
FIG. 2 shows the installation device of FIG. 1 in a frontal view.
Figure 3:
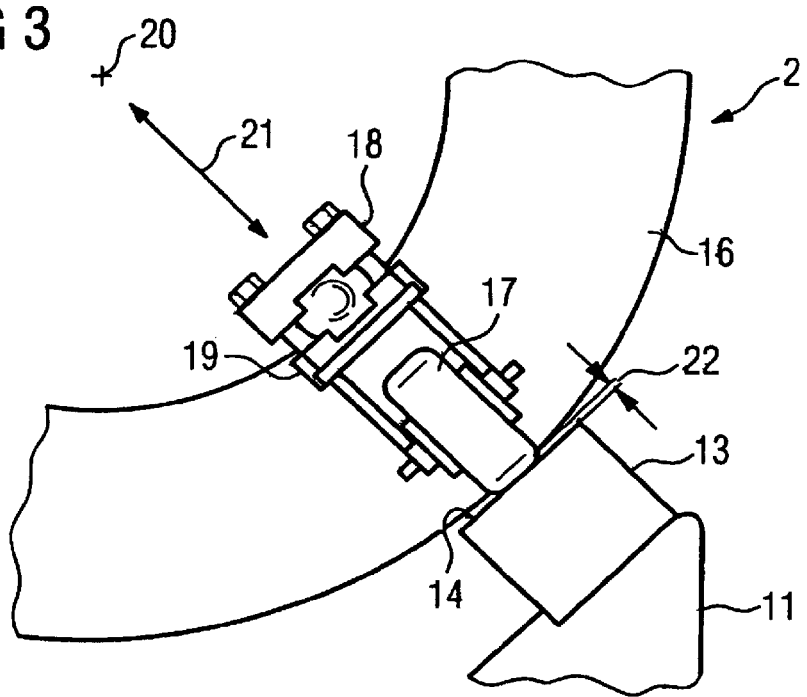
FIG. 3 shows, as a detail from FIG. 2, a track roller fastened on the gradient coil module.

FIG. 2 shows the installation device 1 according to Arrow II in FIG. 1. In a detail view from FIG. 2, FIG. 3 shows the right of the two track rollers 17. From FIGS. 2 and 3 it is apparent that the track rollers 17 are oriented in the radial direction 21 relative to the middle longitudinal axis 20 of the gradient coil module 2. The track rollers 17 thereby project beyond the cylinder jacket 15 by an overhang 22. From FIG. 3 it is to be learned that this overhang 22 is very small and amounts in practice to only a few millimeters. However, due to the overhang 22 it is ensured that the gradient coil module 2 is supported and can be freely rolled on the two tracks 14 via the four track rollers 17. The gradient coil module 2 is thus movable on both sides in the longitudinal direction 12 in the manner of a cart.

FIG. 4 shows the installation or de-installation of the gradient coil module 2 in a gradient coil receptacle 23 of a magnetic resonance tomography apparatus 24. The gradient coil receptacle 23 is executed like a channel and is accessible via at least one opening accommodating the gradient coil module 2. As is shown in FIG. 1 through 3, four track rollers 19 are attached on both facing sides 6 of the gradient coil module 2 for the installation in the gradient coil receptacle 23. The gradient coil module 2 held and supported by the two tracks 14 of the bearing girders 13 is subsequently rolled into housing of the magnetic resonance tomography apparatus 24 by means of the loading cart 3 via its transport rollers 10. If necessary, the position of the two bearing brackets 8 is adjusted in the vertical direction 5 by means of the adjustment nuts 9 such that the two tracks 14 essentially find their continuation on the inside of the gradient coil receptacle 23. The gradient coil module 2 is subsequently slid into the gradient coil receptacle 23 in the longitudinal direction 12 by means of its track rollers 17. This is possible since the gradient coil module 2 is accommodated in the gradient coil receptacle 23 with a play that is greater than the overhang 22 of the track rollers 19 beyond the cylinder jacket 15 of the gradient coil module 2. The gradient coil module 2 is subsequently fastened in the gradient coil receptacle 23. Through this fastening, the four track rollers 17 are unburdened of the weight of the gradient coil module 2 so that they can be uninstalled. The gradient coil module 2 is now installed in the gradient coil receptacle 23.

An uninstallation of the gradient coil module 2 ensues in the opposite order of the work steps. In other words, two track rollers 17 are initially respectively attached on the two facing sides 16 of the gradient coil module by means of their track roller mounts 18. The fastening between the gradient coil module 2 and the gradient coil receptacle 23 is subsequently released. The weight of the gradient coil module 2 is now supported by the track rollers 17. The loading cart 3 is additionally rolled up to the magnetic resonance tomography apparatus 24 so that its two tracks 14 form a continuation of the inside of the gradient coil receptacle 23. The gradient coil module 2 is slid out from the gradient coil receptacle 23 and onto the two tracks 14 by means of the track rollers 17 of said gradient coil module 2. As soon as all four track rollers 17 rest entirely on the tracks 14, the loading cart 3 with the gradient coil module 2 can be moved away from the magnetic resonance tomography apparatus 24.

According to FIG. 5, the track roller 17 is borne such that it can rotate via a shaft 25 at a U-shaped retaining body 26. The retaining body 26 is attached at the installation plate 19 with four fastening bolts 27. Due to the square geometry of the installation plate 19, the retaining body 26 with the track roller 17 can be bolted onto the installation plate 19 at 90° intervals. In other words, the track roller 17 can be installed on the installation plate 19 in the longitudinal direction 12 or in the transverse direction 7. The different installation variants are symbolized by the arrow 28. The track roller 17 is oriented in the longitudinal direction 12 in FIG. 5.

The track roller mount 18 is fashioned in an L shape. The installation plate 19 with the track roller 17 is attached on the underside of its first L-leg 29. A blade-like extension 31 in the longitudinal direction 12 is attached in the at the free end of its second L-leg 30 oriented in the vertical direction 5.

A wedge 32 that can be shifted in the longitudinal direction 12 via an adjustment screw (not visible in FIG. 5) is arranged between the underside of the first L-leg 29 and the installation plate 19. The distance between the installation plate 19 and the first L-bar 29 is variable in the vertical direction 5 in this manner. The projection 22 of the track roller 17 attached on the installation plate 19 is therefore adjustable in the vertical direction 5. The track rollers can be installed in this way even when the gradient coil module 2 rests on the inner wall of the gradient coil receptacle 23 or the tracks 14 of the bearing girders 13.

FIG. 6 shows the installation device 1 of FIG. 1 through 4 on which a second gradient coil module 2 is placed. This gradient coil module 2 possesses a larger diameter than that of the gradient coil module of FIG. 1 through 4.

Multiple recesses 33 extending into the wall of the gradient coil module 2 in the longitudinal direction 12 are provided on the facing side 16 of the gradient coil module 2, which recesses 33 are fashioned to accommodate shim elements. These shim elements are metal bands that are provided in the recesses 33 for fine tuning of the field gradients generated by the gradient coil module. The shim elements are not shown in FIG. 6.

To install a track roller 17, a shim element is initially drawn out from its pocket-like recess 33. The track roller mount 18 of the track roller 17 is subsequently inserted into the recess 33 with its blade-like projection 31 such that the second L-leg 30 of the track roller mount 18 is oriented in the radial direction 22 relative to the middle longitudinal axis 21 of the gradient coil module 2 and rests on the facing side 16 with its side oriented towards said facing side 16. Since the blade-like projection 31 has precisely the same length as a shim element, the track roller mount 18 with the track roller 17 is held in the recess 33 with nearly no play. The attachment of the track roller mount 18 by means of the blade-like extension 31 ensues by means of a simple insertion into the recess 33. A use of a tool to install the track roller 17 is thus not necessary.

FIG. 7 shows two track roller mounts 18 with blade-like extensions 28 that are connected with one another by means of a bridge-like connection 34 at their first L-legs 29. The two track roller mounts 17 with the track rollers 17 installed on them thus form an installation unit 35. To install this installation unit 35, two shim elements are initially removed from their recesses 33. The two blade-like extensions 31 are subsequently inserted into the recesses 33. The installation unit 35 is adapted—in terms of the geometry of the bridge-like connection 34—to the position of the recesses 33 in the gradient coil module 2 such that both blade-like extensions 31 can be respectively inserted into a recess 33. A particularly play-free seating of the track roller mounts 18 can be achieved by means of the bridge-like connection 34 since the two track roller mounts 18 brace one another in the transverse direction 7. A particularly smooth displacement of the gradient coil module 2 via the track rollers 19 is achieved in this manner.

A central (in the transverse direction 7) receptacle 36 for an installation tool (not shown in FIG. 7) is provided at the bridge-like connection 34. The receptacle 36 initially possesses in the longitudinal direction 12 at least two guide elements 37 and a recess 38, leaving a gap free.

Figure 8:
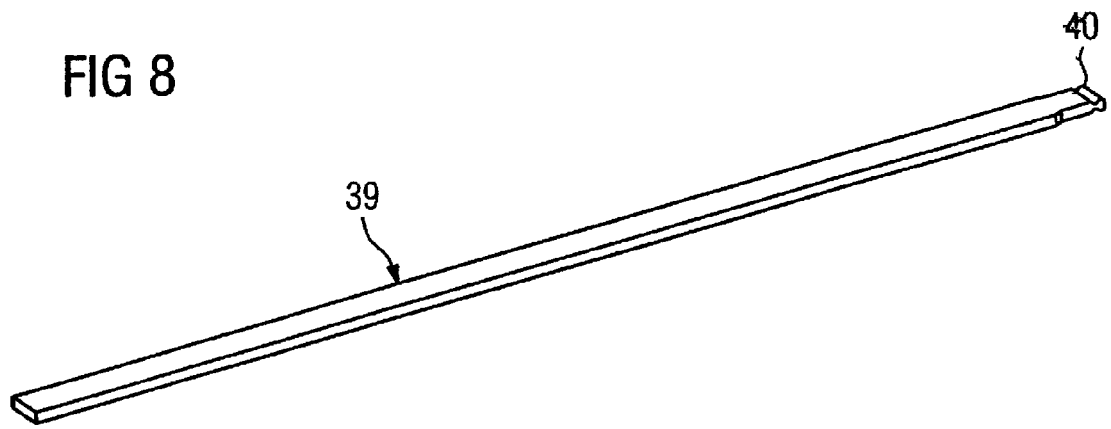
FIG. 8 shows an installation tool.

FIG. 8 shows an installation tool 39 fashioned as a four-cornered bar. One of the two free ends is fashioned as a retention hook 40. The installation tool 39 is slid through between the guide element 37 of the receptacle 36 until the retention hook 40 engages in the recess 38. In this way the installation unit 35 with the two track rollers 17 can be installed and de-installed given a gradient coil module 2 inserted into the gradient coil receptacle 23.

Figure 9:
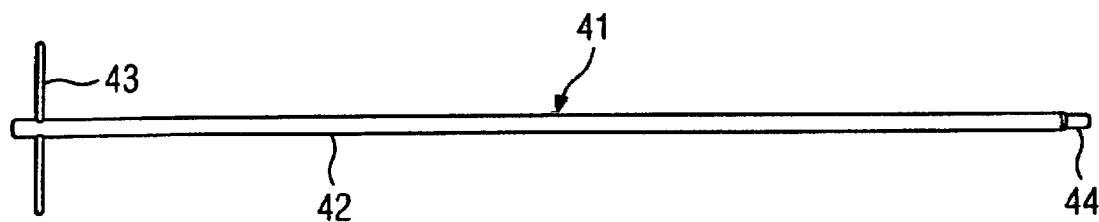
FIG. 9 shows a height adjustment tool.

FIG. 9 shows a height adjustment tool 41 with a long bar 42 and a tool 44 fashioned as a sprocket. The tool part 44 is fashioned to overlap the bolt associated with the wedge 32. The height of the track rollers 17 can be adjusted by means of the height adjustment tool 41 given a gradient coil module 2 inserted into the gradient coil receptacle 23.

Figure 10:
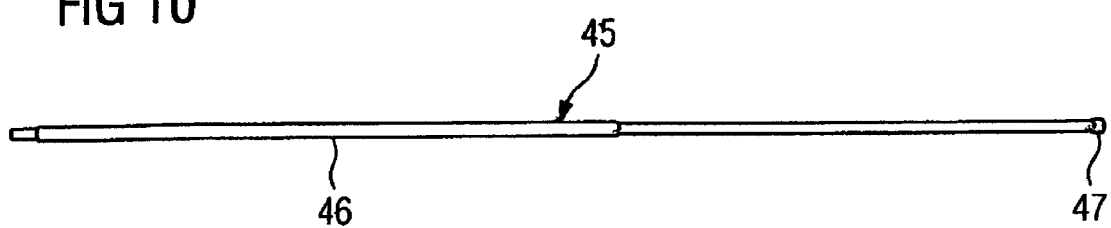
FIG. 10 shows a positioning tool.

According to FIG. 10, a positioning tool 45 possesses a long bar 46 and a tool part 47 fashioned as a sprocket at one free end of said long bar 46. The tool part 47 is fashioned to overlap one free end of the shaft 24 associated with the track roller 17. In this way the gradient coil module 2 (with track rollers 17 installed in the transverse direction 7) inserted into the gradient coil receptacle can be displaced in the circumferential direction around its central longitudinal axis 20 via an engagement of the positioning tool 45 at the shaft 25 of the track rollers 17.

By means of the installation tool 39, the adjustment tool 41 and the positioning tool 45, an installation and de-installation of the gradient coil module 2 is installed and de-installed from outside the gradient coil receptacle 23 even in a magnetic resonance tomography apparatus 24 with a very long gradient coil receptacle 23. The installation and de-installation thus can be executed even in a magnetic resonance tomography apparatus executed according to the UHF technique and with an active basic magnetic field, since no service technician enter the gradient coil receptacle.

For the installation of the gradient coil module 2, the installation tool 39 with its retention hook 40 is inserted into the receptacle 36 of the installation unit 35 until the retention hook 40 engages in the recess 38. The gradient coil module 2 is subsequently rolled into the gradient coil receptacle 23 up to its destination. There the track rollers 17 are adjusted relative to the middle longitudinal axis 20 of the gradient coil module 2 by means of the adjustment tool 41. The gradient coil module 2 is thereby set down with its cylinder jacket 15 at its destination. The installation unit 35 can subsequently be drawn out from the recesses 33 and ultimately from the gradient coil module 2.

If necessary, a positioning of the gradient coil module 2 in the circumferential direction subsequently ensues. For this the track rollers 17 are attached in the transverse direction 7 at the track roller mounts 18. The installation unit 35 is subsequently reinstalled on the gradient coil module 2 with the installation tool 39. The gradient coil module is now installed in the circumferential direction in the manner described according to FIG. 10 by means of one positioning tool 45 per track roller 17.

FIG. 11 shows the placement of the gradient coil 2 from FIG. 1 through 4 on the loading cart 3. For this the gradient coil module 2 is borne on a pallet 48 that possesses a channel 49 fashioned in the longitudinal direction. The channel 49 is matched to the geometry of the hollow cylindrical gradient coil module 2 such that a rolling of the gradient coil module 2 away in the transverse direction 7 is securely avoided. For the placement of the gradient coil module 2 onto the loading cart 3, one of the two bearing girders 13 was removed. The gradient coil module 2 is raised by means of the pallet 48 by means of a forklift, of which only the two tines 50 resting on the underside of the pallet 48 are visible.

Two recesses are introduced on the facing side 16 of the gradient coil module 2. A track roller mount 18 (executed according to FIG. 5) with its blade-like extension 28 is inserted into these recesses 33. Given this structural shape of a gradient coil module 2, no recesses are provided for shim elements, such that the recesses 33 are specially provided for the installation of the track rollers.

FIG. 12 shows the installation device 1 with the gradient coil module 2 according to Arrow XII in FIG. 8 in a frontal view. The bearing girders 13 absent in FIG. 11 were installed in the meanwhile. Furthermore, the track roller mounts 18 with their blade-like extensions 28 were inserted into the recesses 53 of the gradient coil module 2. However, the gradient coil module 2 is still held on its cylindrical surface 15 by the pallet 48. For better clarity, the two tines 50 of the forklift are not shown in FIG. 9. If the pallet 48 is now moved downward in the vertical direction 2 by means of the two tines, the gradient coil module 2 rests by means of its track rollers 17 on the tracks 14 of the loading cart 3. It can now shift to both sides in the longitudinal direction 12.

The lowering of the pallet 32 by means of the tines 34 is shown in FIG. 13. In FIG. 13, however, the track rollers 17 are not yet installed. In this case the gradient coil module 2 is held on its cylinder jacket 16 by means of the two bearing girders 13. The installation of the track rollers 17 ensues in the manner described for FIG. 5.

Although modifications and changes may be suggested by those skilled in the art, it is the intention of the inventors to embody within the patent warranted hereon all changes and modifications as reasonably and properly come within the scope of their contribution to the art.

We claim as our invention:

1. An installation device for installing a gradient coil module in a scanner housing of a magnetic resonance apparatus having an opening therein, said installation device comprising:
   a loading cart configured to receive and move a gradient coil module away from and toward an opening of a housing of a magnetic resonance tomography apparatus;
   said loading cart having a bearing girder fastened thereto, said bearing girder comprising a track; and
   track rollers that are installable on said gradient coil module to allow the gradient coil module to be moved relative to the loading cart by said track rollers rolling on said track.

2. The installation device as claimed in claim 1 wherein each track roller has a track roller mount that installs the track roller associated therewith at the gradient coil module.

3. The installation device as claimed in claim 1 wherein said gradient coil module is a hollow cylindrical gradient coil module having an exterior cylinder jacket, and wherein said track rollers project beyond said cylinder jacket.

4. The installation device as claimed in claim 1 wherein said track rollers are height-adjustable.

5. The installation device as claimed in claim 1 wherein said bearing girder is height-adjustable.

6. The installation device as claimed in claim 1 wherein said bearing girder is a first bearing girder, and comprising a second bearing girder facing said first bearing girder.

7. The installation device as claimed in claim 1 wherein said gradient coil module has two facing sides, and wherein said installation device comprises two track rollers at each of said two facing sides of said gradient coil module.

8. The installation device as claimed in claim 1 wherein each of said facing sides is formed by a wall of said gradient coil module, said wall having a recess therein, and comprising a track roller mount with a blade-like projection insertable in said recess to mount a track roller at said wall of said gradient coil module.

9. The installation device as claimed in claim 8 wherein said gradient coil module comprises a plurality of pocket-shaped recesses respectively for receiving shim elements therein.

10. The installation device as claimed in claim 1 comprising, for each of said track rollers, a track roller mount that mounts the track roller to the gradient coil module, and comprising an installation plate disposed between each track roller mount and the track roller associated therewith.

11. The installation device as claimed in claim 1 comprising two track roller mounts connected to each other forming a bridge, and each of said two track roller mounts carrying one of said track rollers.

12. The installation device as claimed in claim 1 comprising an installation tool configured to assist in installation and de-installation of said track rollers in said gradient coil module inserted into said opening.

13. The installation device as claimed in claim 12 comprising a height adjustment tool configured to interact with each track roller in a gradient coil module inserted into said opening, to adjust a height thereof.

14. The installation device as claimed in claim 1 comprising a positioning tool configured to position said gradient coil module in said opening.

15. The installation device as claimed in claim 1 wherein said bearing girder is configured to be disassembled from said cart by a releasable connection.

16. The installation device as claimed in claim 1 comprising a pallet matched to geometry of said gradient coil module to carry said gradient coil module when said gradient coil module is out of said opening.

17. The installation device as claimed in claim 1 comprised substantially completely of non-magnetic material.

* * * * *